United States Patent
Negreira et al.

(10) Patent No.: US 11,915,973 B2
(45) Date of Patent: Feb. 27, 2024

(54) SELF-ASSEMBLED MONOLAYERS AS SACRIFICIAL CAPPING LAYERS

(71) Applicant: Tokyo Electron Limited, Tokyo (JP)

(72) Inventors: Ainhoa Romo Negreira, Leuven (BE); Yumiko Kawana, Nirasaki (JP); Dina Triyoso, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 17/115,231

(22) Filed: Dec. 8, 2020

(65) Prior Publication Data

US 2021/0175118 A1 Jun. 10, 2021

Related U.S. Application Data

(60) Provisional application No. 62/946,243, filed on Dec. 10, 2019.

(51) Int. Cl.
*H01L 21/768* (2006.01)
*H01L 21/02* (2006.01)
*H01L 21/687* (2006.01)

(52) U.S. Cl.
CPC .. *H01L 21/76834* (2013.01); *H01L 21/02164* (2013.01); *H01L 21/02282* (2013.01); *H01L 21/02301* (2013.01); *H01L 21/02318* (2013.01); *H01L 21/68764* (2013.01)

(58) Field of Classification Search
CPC ......... H01L 21/76834; H01L 21/02164; H01L 21/02282; H01L 21/02301; H01L 21/02318; H01L 21/68764
See application file for complete search history.

(56) References Cited

U.S. PATENT DOCUMENTS

| 9,418,834 B2 | 8/2016 | Negreira et al. | |
| 2003/0089891 A1* | 5/2003 | Andreas | H01L 21/3212 252/500 |
| 2006/0209117 A1* | 9/2006 | Parazak | B82Y 40/00 347/21 |
| 2011/0318695 A1* | 12/2011 | Hwang | B82Y 40/00 430/322 |
| 2013/0337236 A1* | 12/2013 | Cott | H01L 51/057 428/173 |
| 2017/0114451 A1* | 4/2017 | Lecordier | C22B 15/00 |

(Continued)

FOREIGN PATENT DOCUMENTS

KR 10-2017-0135760 A 12/2017

OTHER PUBLICATIONS

Korean Intellectual Property Office, International Search Report and Written Opinion for International application No. PCT/US2020/063770, dated Apr. 7, 2021, 9pp.

*Primary Examiner* — Dale E Page
*Assistant Examiner* — Quovaunda Jefferson

(57) ABSTRACT

A substrate processing method includes providing a substrate containing a metal surface and a dielectric material surface, selectively forming a sacrificial capping layer containing a self-assembled monolayer on the metal surface, removing the sacrificial capping layer to restore the metal surface, and processing the restored metal surface and the dielectric material surface. The sacrificial capping layer may be used to prevent metal diffusion into the dielectric material and to prevent oxidation and contamination of the metal surface while waiting for further processing of the substrate.

22 Claims, 3 Drawing Sheets

(56) References Cited

U.S. PATENT DOCUMENTS

| | | |
|---|---|---|
| 2017/0342553 A1 | 11/2017 | Yu et al. |
| 2018/0076027 A1* | 3/2018 | Tapily ............... H01L 21/31111 |
| 2018/0218914 A1* | 8/2018 | Basu ................ H01L 21/02205 |
| 2018/0294157 A1* | 10/2018 | Cheng ................ C23C 16/0245 |
| 2018/0326412 A1 | 11/2018 | Rothberg |
| 2019/0164749 A1 | 5/2019 | Tapily |
| 2019/0338414 A1 | 11/2019 | Grimes et al. |

* cited by examiner

SELF-ASSEMBLED MONOLAYERS AS SACRIFICIAL CAPPING LAYERS

CROSS-REFERENCE TO RELATED APPLICATIONS

This application claims priority to U.S. Provisional Patent Application No. 62/946,243, entitled, "Self-Assembled Monolayers as Sacrificial Capping Layers," filed Dec. 10, 2019; the disclosure of which is expressly incorporated herein, in its entirety, by reference.

FIELD OF THE INVENTION

The present invention relates to semiconductor processing and semiconductor processing systems, and more particularly, to a method for forming self-assembled monolayers as sacrificial capping layers to protect exposed materials during semiconductor processing.

BACKGROUND OF THE INVENTION

Many metals diffuse easily into dielectric materials under thermal and/or electric stress, thereby causing a dielectric failure. In semiconductor devices, copper (Cu) metal is used as an interconnecting conductor in order to provide low electrical resistance within the devices. In order to prevent metal diffusion, Cu metal deposited in recessed features is surrounded by one or more diffusion barrier layers on the sides and bottom of the recessed features. Cu metal filling of the recessed features is often followed by a chemical mechanical polishing (CMP) process to remove excess Cu metal and planarize the Cu metal in the recessed features relative to the adjacent dielectric material. After the CMP process, a capping layer may be deposited on the planarized Cu metal. Ta/TaN or CoWP capping layers have been used but the process of selectively depositing a metal capping layer on the Cu metal and subsequently removing the metal capping layer is problematic and can affect reliability of the Cu metal interconnects. Furthermore, dielectric capping layers and dielectric etch stop layers (e.g., SiN, SiC, SiCN, and SiCO) have been used but are difficult to deposit selectively on Cu metal surfaces.

SUMMARY OF THE INVENTION

A substrate processing method is described that selectively deposits a sacrificial capping layer on a metal surface to prevent metal diffusion into a dielectric material and to prevent oxidation and contamination of the metal surface while waiting for further processing of the substrate. The sacrificial capping layer may then be removed to provide a clean metal surface for further processing the substrate.

According to one embodiment, the substrate processing method includes providing a substrate containing a metal surface and a dielectric material surface, selectively forming a sacrificial capping layer containing a self-assembled monolayer on the metal surface, removing the sacrificial capping layer to restore the metal surface, and processing the restored metal surface and the dielectric material surface.

Selectively forming the sacrificial capping layer on the metal surface can include dispensing a chemical solution on the substrate while rotating the substrate, the chemical solution can include a chemical compound containing a carbon group, a bonding group coupled to the carbon group, a terminal group coupled to the carbon group that is opposite the bonding group, and a solvent solution, and annealing the substrate following the dispensing of the chemical solution on the substrate.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

A substrate processing method is described. The substrate may include any material group or structure of a device, particularly a semiconductor or other electronics device, and may, for example, be a base substrate structure, such as a semiconductor substrate or a layer on or overlying a base substrate structure such as a thin film. Thus, the substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. The substrate may include a round substrate (wafer) with a diameter of at least 150 mm, 200 mm, 300 mm, or 450 mm.

Figure 1:
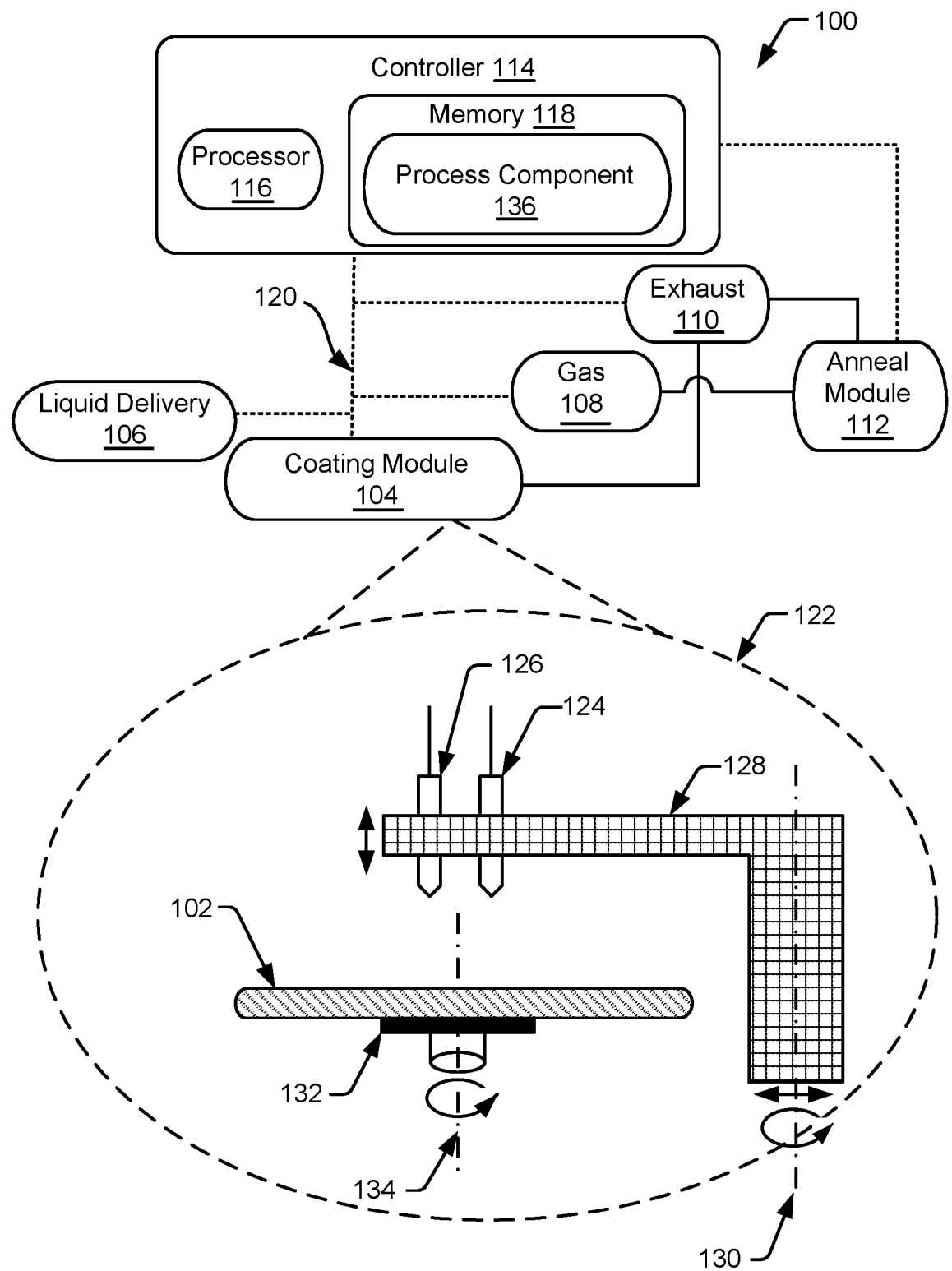
FIG. 1 is an illustration of a representative embodiment of a spin-coating processing system that includes a cross-section illustration of a coating module of the spin-coating processing system.

FIG. 1 depicts a spin-coating processing system 100 for dispensing chemicals onto a substrate 102 using a coating module 104 that is in fluid communication with a liquid delivery system 106 that may dispense one or more types of liquid chemicals. The system 100 may also include a gas delivery system 108 that may provide gas to the coating module 104 that may be removed via an exhaust system 110. A liquid drain (not shown) may also be incorporated into the exhaust system to remove liquids from the coating module 104. The system 100 may also include an anneal module 112 that may bake or apply light radiation to the substrate 102 after the chemicals have been dispensed. A controller 114 may be used control the components of the system 100 using an electrical communication network that may send or receive computer-executable instructions or electrical signals between the system 100 components. The controller 114 may include one or more computer processors 116 and memory 118 that may store computer-executable instructions that may be executed by the computer processors or other logic/processing devices. The controller 114 may store process component 136 that can include a recipe or process condition routines that may be implemented by controlling or directing the components of the system 100 to obtain certain conditions within the coating module 104 and/or the anneal module 112. Communication between the components may be implemented through processing and electrical communication techniques known to a person of ordinary skill in the art, as represented by the dashed lines 120.

The computer processors 116 may include one or more processing cores and are configured to access and execute (at least in part) computer-readable instructions stored in the one or more memories. The one or more computer processors 116 may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The computer processors 116 may also include a chipset(s) (not shown) for controlling communications between the components of the system 100. In certain embodiments, the computer processors may be based on Intel™ architecture or ARM™ architecture and the processor(s) and chipset may be from a family of Intel™ processors and chipsets. The one or more computer processors may also include one or more application-specific integrated circuits (ASICs) or application-specific standard products (ASSPs) for handling specific data processing functions or tasks.

The memory 118 may include one or more non-transitory computer-readable storage media ("CRSM"). In some embodiments, the one or more memories may include non-transitory media such as random access memory ("RAM"), flash RAM, magnetic media, optical media, solid state media, and so forth. The one or more memories may be volatile (in that information is retained while providing power) or non-volatile (in that information is retained without providing power). Additional embodiments may also be provided as a computer program product including a non-transitory machine-readable signal (in compressed or uncompressed form). Examples of machine-readable signals include, but are not limited to, signals carried by the Internet or other networks. For example, distribution of software via the Internet may include a non-transitory machine-readable signal. Additionally, the memory may store an operating system that includes a plurality of computer-executable instructions that may be implemented by the processor to perform a variety of tasks to operate the system 100.

FIG. 1 also includes a representative illustration 122 of one embodiment of the coating module 104 that may dispense chemicals onto the substrate 102. The system 100 may be used to dispense one or more liquid chemicals that may be distributed across the substrate 102 by either rotating the substrate 102, translating the substrate 102, or rotating or translating the locations of the liquid dispensers. The liquid dispensers 124, 126, may disposed above the substrate 102 may be moved across or around to any position above or adjacent to the substrate 102 using the positioning mechanism 128. In the embodiment in FIG. 1, the positioning mechanism 128 may move forward and backward in a horizontal and/or vertical plane as indicated by the arrows adjacent to the positioning mechanism 128. The positioning mechanism 128 may also be rotated around the positioning mechanism's 128 vertical axis 130. The positioning mechanism 128 may dispense chemicals at discrete locations around the substrate 102 or they may be dispensed as the positioning mechanism 128 moves across the substrate 102. The chemicals may be disposed in a continuous or non-continuous manner onto the substrate. The chemicals may be dispensed one at a time in several movements across the substrate 102 or the chemicals may be dispensed at the same location, but at different times.

The substrate 102 may be secured to a rotating chuck 132 that supports the substrate 102 and may rotate the substrate 102 during the chemical dispensing. The substrate 102 may be rotated around the rotation axis 134 with up to speeds of 2200 revolutions per minute (rpm). The chemical dispense may occur before, during, and/or after the substrate 102 starts to rotate.

Prior to or after the chemical dispensing, the substrate 102 may be treated in the anneal module 112 that may heat the substrate 102 up to remove moisture from the substrate 102 prior to the chemical dispensing or to treat the film deposited on the substrate 102 by the coating module 104. The anneal module 112 may include, but is not limited to, a resistive heating element (not shown) that transfers heat via conduction to the substrate 102. In another embodiment, the anneal module 112 may include a radiation source (not shown) that exposes the substrate 102 to radiation. The radiation source may include, but is not limited to, an ultraviolet light (UV) source (not shown). The anneal module 112 may also heat the substrate 102 via convection by receiving heated gas from the gas delivery system 108. The anneal module 112 may also treat the substrate 102 with relatively inert gases, with respect to the substrate 102 or deposited film, to prevent chemical reactions with the ambient or surrounding environment (e.g., oxygen, moisture, etc.). The gases may also be used to remove gas or fluid that is out-gassed from the deposited film during the anneal treatment. The out-gassed chemicals may be removed by the exhaust system 110 that removes the gases from the anneal module 112.

Figure 2:
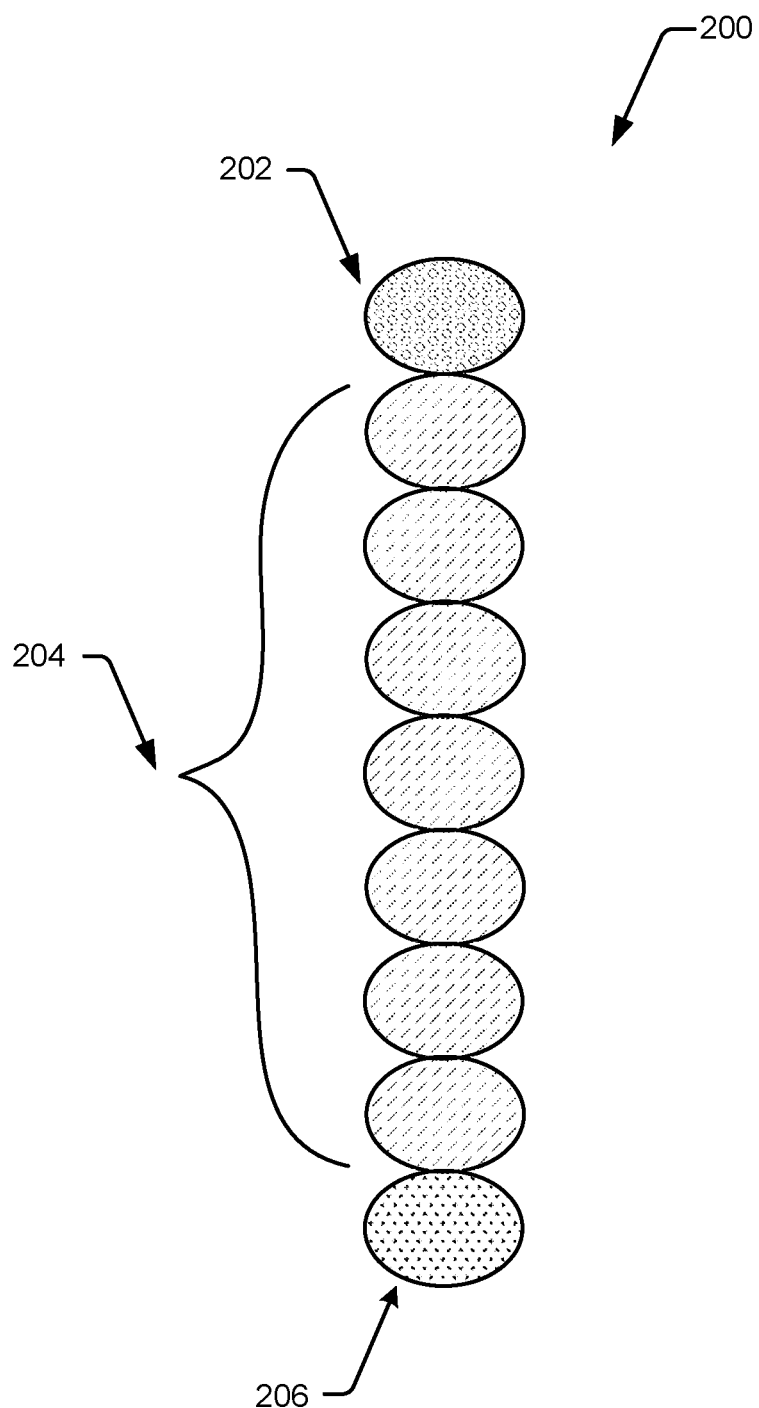
FIG. 2 is an illustration of a representative embodiment of a group of a self-assembled monolayer.

FIG. 2 is an illustration of a representative embodiment of a group of a self-assembled monolayer (SAM) 200 that may be formed on the substrate 102. SAMs are widely known as surface modification agents and adhesion layers. The SAM 200 shown in FIG. 2 is intended for illustrative purposes to explain the components of the SAM 200. In application, the SAM 200 may be used with a plurality of SAM 200 that arrange themselves in a systematic manner on the substrate 102. In brief, the plurality of SAM 200 may form a three-dimensional crystalline or semi-crystalline structure on the surface of the substrate 102. The SAM 200 may have a thickness of less than 1 nm. The SAM 200 may include a chemical compound that includes a terminal group 202, a chain group 204, and bonding group 206. These groups may form the building blocks of the SAM 200 and that the interactions between these groups and the substrate 102 may form a three-dimensional structure. The molecular self-assembly may due to a combination of van der Waals interactions, hydrophobic interactions, and/or molecule-substrate interactions that form highly ordered low-dimensional structures spontaneously on the substrate 102 or overlying films (not shown).

Broadly, the bonding group 206 may be coupled to or chemisorbed to the substrate 102. The bonding group 206 may be chemically attracted to the substrate 102 or to a film or layer on the substrate 102, such as a metal layer. However, the terminal group 202 and the chain group 204 may be not be coupled to or chemisorbed into the substrate 102, or at least not coupled in the same way as the bonding group 206. The chain group 204 and the terminal group 202 may assemble themselves as shown in FIG. 2. As a result of this selective assembly, the SAM 200 may appear to stand on end with the bonding group 206 secured to the substrate 102 and the terminal group 202 and chain group 206 being tethered to the substrate 102 via the bonding group 206.

The SAM 200 may be used for a variety of applications and the composition of the groups, or building blocks, may vary depending on the desired structure and the type of substrate 102. According to one embodiment, the bonding group 206 may be any reactive element that can bond or chemically react with a desired material layer on the substrate 102, for example a metal layer, and only weakly bond to a different material, for example a dielectric material. In case of a metal layer, in some examples, the bonding group 206 can include a thiol, a silane, or a phosphonate. The chain group 204 may include a chain of carbon elements that are may be connected or bonded together. Although FIG. 2 illustrates one group of the SAM 200, the chain group 204 may be bonded with adjacent chain groups that may form the larger SAM structure (not shown). The chain group 204 may include $C_xH_y$ molecules that may be bonded together to form the three-dimensional structure of the SAM 200 across the surface of the substrate 102. The terminal group 202 may be assembled above the chain group 204 and may be selected based on the application of the SAM 200. Examples of the SAM 200 include, but are not limited to, 1-octadecanethiol ($CH_3(CH_2)_{16}CH_2SH$), perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro)dimethylsilane (($CH_3)_3CSi(Cl)(CH_3)_2$)).

According to one embodiment, the substrate 102 has a metal wiring formed in a dielectric material, where the metal wiring is at least partially exposed. Some embodiments of the invention describe a method for selectively forming a sacrificial capping layer containing a self-assembled monolayer on a metal surface that may be used to prevent metal diffusion into the dielectric material and to prevent oxidation of an exposed metal surface, thereby allowing the substrate 102 to be processed without being constrained by a Q-time. Here, the term "Q-time" refers to a time limit that is set with respect to a time period after a substrate 102 is subjected to, for example dry etching, in order to prevent oxidation or the like of the metal wiring exposed by the dry etching, before further processing of the substrate 102. When a Q-time is set, time management is necessary in order to comply with the Q-time. Therefore, there is a risk that productivity may decrease due to an increase in processing time. Further, when the set Q-time is short, line management becomes difficult. There is also a concern that the productivity may decrease due to complication of the line management.

FIGS. 3A-3D schematically show a method for using a self-assembled monolayer as a sacrificial capping layer according to an embodiment of the invention. In the schematic cross-sectional view in FIG. 3A, the substrate 3 is patterned and contains recessed features in a dielectric material 300, where the recessed features contain a barrier/liner layer 302 that surrounds a metal 304 on the sidewall and the bottom of the recessed features. The substrate 3 includes an exposed metal surface 303 and an exposed dielectric material surface 301. In one example, the metal surface 303 can include a metal selected from the group consisting of Cu, Al, Ta, Ti, W, Ru, Co, Ni, and Mo. In one example, the dielectric material surface includes silicon. In another example, the dielectric material surface includes $SiO_2$ or a low-k material.

The exemplary substrate 3 is planarized with the metal surface 303 and the dielectric material surface 301 in the same horizontal plane. The planarization may utilize a CMP process, followed by a cleaning process to remove any impurities and oxidation from the surfaces of the substrate 3. In some examples, the substrate 3 may contain Cu metal surface 303 and $SiO_2$ or dielectric material surface 301. In one example, a wet cleaning process using an aqueous citric acid solution may be used to remove oxidized Cu metal from a Cu metal surface 303. In another example, the cleaning process may include a dry cleaning process.

Following the cleaning process, the time between the cleaning process and further processing of the substrate 3, needs to be short in order to avoid Cu metal diffusion from the Cu metal 304 to the dielectric material 300 along the top of the substrate 3 and to avoid oxidation of the Cu metal surface 303 by exposure to oxygen-containing background gases. In one example, the further processing can include selectively depositing a dielectric film on the dielectric material surface 301 by a gas phase exposure, where a clean, unoxidized, Cu metal surface 303 is required to achieve required deposition selectivity between the dielectric material surface 301 and the Cu metal surface 303. Selective deposition of a dielectric film on the dielectric material surface 301 may be used for forming a fully self-aligned via (FSAV) over the Cu metal surface 303.

Figure 3A:
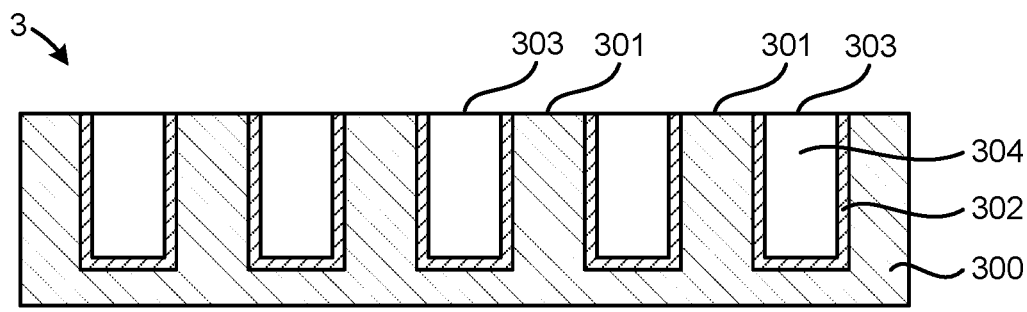
FIGS. 3A-3D show schematic cross-sectional views of a method of processing a substrate according to an embodiment of the invention.
Figure 3B:
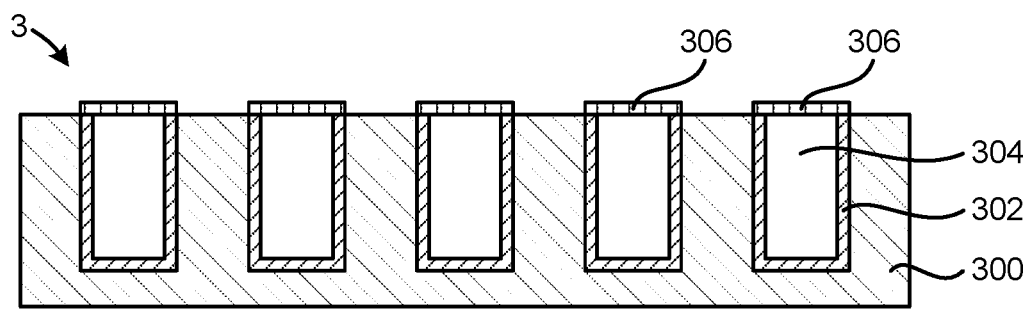

The method further includes, as schematically shown in FIG. 3B, selectively forming a sacrificial capping layer 306 containing a self-assembled monolayer on the exposed metal surface 303 relative to the dielectric material surface 301. The sacrificial capping layer 306 may be formed using the spin-coating processing system 100 described in FIG. 1. A chemical solution containing a SAM chemical (e.g., 1-octadecanethiol) may be dispensed by the coating module 104 onto the substrate 3. The chemical solution may further include a solvent, for example an organic solvent. The amount of the chemical solution that is dispensed should enable at least a majority of the substrate 3 to be covered by the chemical solution. In one example, a concentration of the SAM chemical in the chemical solution can be about 5 mM, or less. The substrate 3 may be rotated during the application of the chemical solution, for example at a rotation speed between about 800 rpm and about 2200 rpm.

The bonding group of the SAM chemical contains a reactive element (e.g., a thiol group) that can bond or chemically react with the exposed metal surface 303 of the metal 304, while only weakly interacting with the dielectric material surface 301 of the dielectric material 300. Thereafter, a rinsing solution (e.g., isopropyl alcohol (IPA)) may be dispensed by the coating module 104 on the substrate 3 to remove any excess chemical solution from the substrate 3, including any weakly bound SAM chemical from the dielectric material surface 301 of the dielectric material 300.

Thereafter, the substrate 3 may be removed from the coating module 104 to the anneal module 112 that may include a resistive heating element or a radiation source (e.g., UV light). In the anneal module 112, the substrate 3 may be annealed at a temperature that is below the desorption temperature and the degradation temperature of the SAM on the exposed metal surface 303. In one example, using a SAM chemical 1-octadecanethiol, the substrate 3 may be annealed at a temperature of less than 160° C. (the degradation temperature), for a time period of about 5 minutes, or less. In other embodiments, the substrate 3 may be removed from the system 100 and annealed in a separate tool (e.g., bake oven, furnace, etc.). The annealing may enable or improve the self-assembly of the SAM chemical components on the substrate 3 to form the sacrificial capping layer 306 on the exposed metal surface 303 of the metal 304. Thereafter, the substrate 3 may be transferred to the coating module 104 for additional rinsing, followed by a soft bake in the anneal module 112. The soft bake may be performed at a temperature of less than 160° C. This series of steps selectively forms an ordered sacrificial capping layer 306 on the exposed metal surface 303, while the dielectric material surface 301 remains at least substantially free of the SAM chemical.

The characteristics of the sacrificial capping layer 306 may include one or more of the following characteristics: uniform thickness distribution on the metal surface 303 across the substrate 3 within the range of the thickness of one monolayer and a uniform water contact angle appropriate to the terminal group of the SAM. The sacrificial capping layer 306 protects the metal surface 303 against adverse effects such as oxidation and metal diffusion from the metal 304 into the dielectric material 300, thereby removing the need to set a Q-time. Since setting a Q-time is not required, time management for compliance with Q-time becomes unnecessary, complication of line management due to compliance with Q-time is prevented, leading to improved productivity in device manufacturing.

Following the selective formation of the sacrificial capping layer 306 on the metal surface 303, the substrate 3 may be placed in a holding pattern and stored prior to removing the sacrificial capping layer 306 from the substrate 3 and further processing the substrate 3.

According to another embodiment, the sacrificial capping layer 306 may be formed on the exposed metal surface 303 by exposing the substrate 3 to reactant gas containing a chemical compound (e.g., 1-octadecanethiol) capable of form a self-aligned monolayer. The reactant gas may further include an inert gas.

Figure 3C:
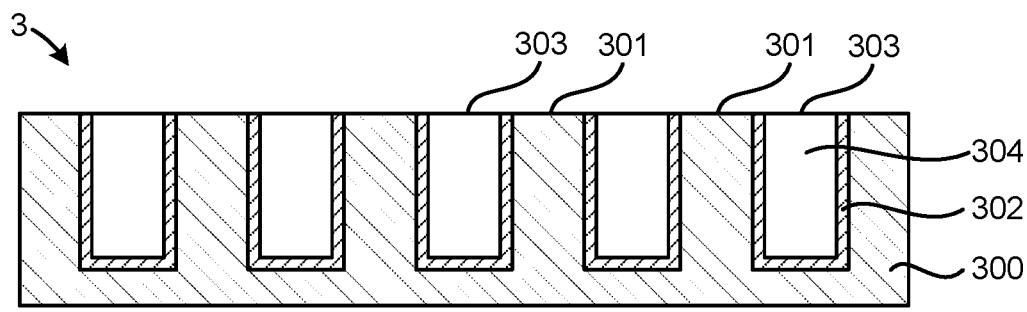

In one example, the substrate 3 may be transferred to the anneal module 112 and annealed at a temperature that results in desorption of the sacrificial capping layer 306 from the substrate 3 to restore the metal surface 303 and the dielectric material surface 301 before further processing. The resulting substrate 3 is schematically shown in FIG. 3C. In another example, the substrate 3 may be transferred to another processing system or to another processing platform where the sacrificial capping layer 306 may be removed. Alternatively, the sacrificial capping layer 306 may be removed using a gaseous exposure to plasma-excited $H_2$ gas and optional substrate heating. In addition to removing the sacrificial capping layer 306, a gaseous exposure to plasma-excited $H_2$ gas may further clean the dielectric material surface 301 without damaging the dielectric material surface 301.

According to some embodiments of the invention, the metal surface and the restored metal surface are clean and not chemically modified. In one example, the metal surface and the restored metal surface are not oxidized.

Figure 3D:
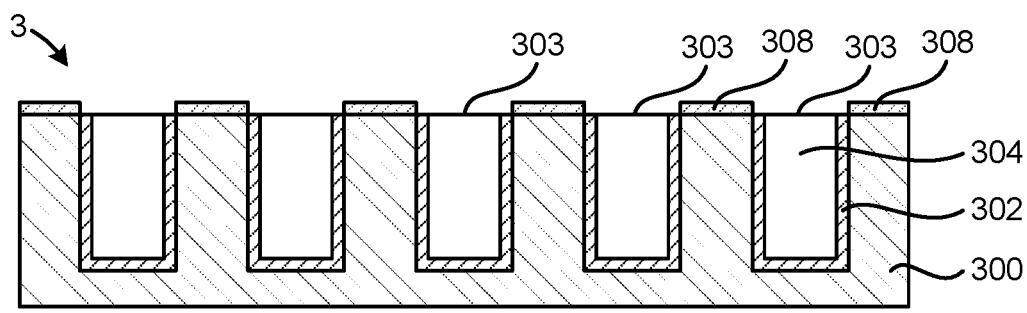

In one example, the further processing can include deposition process that includes selectively depositing a dielectric layer 308 (e.g., $SiO_2$) on the exposed dielectric material surface 301 in an area selective deposition (ASD) process. This is schematically shown in FIG. 3D. In one example the selective deposition includes adsorbing a metal-containing catalyst layer on the dielectric material surface, and in the absence of any oxidizing and hydrolyzing agent, at a substrate temperature of approximately 150° C., or less, exposing the substrate to a process gas containing a silanol gas to selectively deposit a $SiO_2$ film on the dielectric material surface relative to the metal surface. The metal-containing catalyst layer can, for example, include aluminum (Al) or titanium (Ti). In one example, the metal-containing catalyst layer may be formed by exposing the substrate to $AlMe_3$ gas. In one example, the silanol gas is selected from the group consisting of tris(tert-pentoxy) silanol, tris(tert-butoxy) silanol, and bis(tert-butoxy)(isopropoxy) silanol.

A plurality of embodiments for forming self-assembled monolayers as sacrificial capping layers to protect exposed materials during semiconductor processing have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A substrate processing method, comprising:
providing a substrate containing a metal surface and a dielectric material surface;
selectively forming a sacrificial capping layer containing a self-assembled monolayer on the metal surface, wherein the sacrificial capping layer prevents oxidation and contamination of the metal surface while waiting for further processing of the substrate;
removing the sacrificial capping layer to restore the metal surface; and
after removing the sacrificial capping layer, selectively depositing a dielectric film on the dielectric material surface relative to the restored metal surface.

2. The method of claim 1, wherein the metal surface and the restored metal surface are not chemically modified.

3. The method of claim 1, wherein the metal surface and the restored metal surface are not oxidized.

4. The method of claim 1, wherein the selectively forming the sacrificial capping layer on the metal surface includes:
dispensing a chemical solution on the substrate while rotating the substrate, the chemical solution including a chemical compound containing a carbon group, a bonding group coupled to the carbon group, a terminal group coupled to the carbon group that is opposite the bonding group, and a solvent solution; and
annealing the substrate following the dispensing of the chemical solution on the substrate.

5. The method of claim 4, further comprising:
prior to annealing the substrate, dispensing a rinsing solution on the substrate to remove the chemical solution from the dielectric material surface.

6. The method of claim 4, further comprising:
removing oxidized metal from the metal surface prior to selectively forming the sacrificial capping layer.

7. The method of claim 4, wherein the bonding group includes a thiol, a silane, or a phosphonate.

8. The method of claim 4, wherein the chemical compound includes 1-octadecanethiol ($CH_3(CH_2)_{16}CH_2SH$), perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), or tert-butyl(chloro)dimethylsilane (($CH_3)_3CSi(Cl)(CH_3)_2$)).

9. The method of claim 1, wherein the metal surface includes a metal selected from the group consisting of Cu, Al, Ta, Ti, W, Ru, Co, Ni, and Mo.

10. The method of claim 1, wherein the removing the sacrificial capping layer includes annealing the substrate at a temperature that desorbs the sacrificial capping layer from the substrate.

11. The method of claim 1, wherein the dielectric material surface includes $SiO_2$ or a low-k material.

12. The method of claim 1, further comprising:
prior to selectively forming the sacrificial capping layer, removing oxidized metal from the metal surface.

13. The method of claim 1, wherein the selectively forming the sacrificial capping layer on the metal surface includes:
exposing the substrate to reactant gas containing a chemical compound containing a carbon group, a bonding group coupled to the carbon group, a terminal group coupled to the carbon group that is opposite the bonding group, and an inert gas.

14. A substrate processing method, comprising:
providing a substrate containing a metal surface and a dielectric material surface;
selectively forming a sacrificial capping layer containing a self-assembled monolayer on the metal surface, wherein the sacrificial capping layer prevents oxidation and contamination of the metal surface while waiting for further processing of the substrate;
removing the sacrificial capping layer to restore the metal surface; and
after removing the sacrificial capping layer, selectively depositing a dielectric film on the dielectric material surface by a gas phase exposure that includes:
adsorbing a metal-containing catalyst layer on the dielectric material surface; and
in the absence of any oxidizing and hydrolyzing agent, at a substrate temperature of approximately 150° C., or less, exposing the substrate to a process gas containing a silanol gas to selectively deposit a $SiO_2$ film on the dielectric material surface relative to the restored metal surface.

15. The method of claim 14, wherein the silanol gas is selected from the group consisting of tris(tert-pentoxy) silanol, tris(tert-butoxy) silanol, and bis(tert-butoxy)(isopropoxy) silanol.

16. The method of claim 14, wherein the selectively forming the sacrificial capping layer on the metal surface includes:
dispensing a chemical solution on the substrate while rotating the substrate, the chemical solution including a chemical compound containing a carbon group, a bonding group coupled to the carbon group, a terminal group coupled to the carbon group that is opposite the bonding group, and a solvent solution; and
annealing the substrate following the dispensing of the chemical solution on the substrate.

17. The method of claim 16, wherein the bonding group includes a thiol, a silane, or a phosphonate.

18. The method of claim 14, wherein the metal surface includes a metal selected from the group consisting of Cu, Al, Ta, Ti, W, Ru, Co, Ni, and Mo.

19. A method of processing a substrate, the method comprising:
providing a substrate containing a metal surface and a dielectric material surface, wherein the metal surface is not oxidized;
selectively forming a sacrificial capping layer containing a self-assembled monolayer on the metal surface, wherein the sacrificial capping layer prevents oxidation of the metal surface;
removing the sacrificial capping layer to restore the metal surface; and
after removing the sacrificial capping layer, selectively depositing a dielectric film on the dielectric material surface by a gas phase exposure, wherein the selectively forming the sacrificial capping layer on the metal surface includes:
exposing the substrate to reactant gas containing a chemical compound containing a carbon group, a bonding group coupled to the carbon group, a terminal group coupled to the carbon group that is opposite the bonding group, and an inert gas.

20. The method of claim 19, wherein the selectively forming the sacrificial capping layer on the metal surface includes:
dispensing a chemical solution on the substrate while rotating the substrate, the chemical solution including a chemical compound containing a carbon group, a bonding group coupled to the carbon group, a terminal group coupled to the carbon group that is opposite the bonding group, and a solvent solution, wherein the bonding group includes a thiol, a silane, or a phosphonate;
dispensing a rinsing solution on the substrate to remove the chemical solution from the dielectric material surface; and
annealing the substrate following the dispensing of the rinsing solution on the substrate.

21. The method of claim 19, wherein the chemical compound includes 1-octadecanethiol ($CH_3(CH_2)_{16}CH_2SH$), perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), or tert-butyl(chloro)dimethylsilane (($CH_3)_3CSi(Cl)(CH_3)_2$)).

22. The method of claim 19, wherein the processing includes
selectively depositing a dielectric film on the dielectric material surface relative to the metal surface by gas phase exposure.

* * * * *